US008013337B2

(12) United States Patent
Choi et al.

(10) Patent No.: US 8,013,337 B2
(45) Date of Patent: Sep. 6, 2011

(54) THIN FILM TRANSISTOR AND DISPLAY DEVICE USING THE SAME

(75) Inventors: Byoung-Deog Choi, Seoul (KR); Sung-Sik Bae, Suwon-si (KR); Won-Sik Kim, Seoul (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 11/760,876

(22) Filed: Jun. 11, 2007

(65) Prior Publication Data

US 2007/0228398 A1    Oct. 4, 2007

Related U.S. Application Data

(62) Division of application No. 10/827,326, filed on Apr. 20, 2004, now Pat. No. 7,274,037.

(30) Foreign Application Priority Data

Apr. 29, 2003  (KR) .................................. 2003-27339

(51) Int. Cl.
    *H01L 29/04* (2006.01)
(52) U.S. Cl. .............................. 257/59; 257/72; 257/347
(58) Field of Classification Search .................. 257/59,
    257/72, 202, 206–208, 210–211, 347
    See application file for complete search history.

(56) References Cited

U.S. PATENT DOCUMENTS

| 4,809,056 A * | 2/1989 | Shirato et al. ................. 257/347 |
| 4,906,587 A * | 3/1990 | Blake ............................ 438/151 |
| 5,536,950 A | 7/1996 | Liu et al. |
| 5,578,865 A | 11/1996 | Vu et al. |
| 5,821,562 A | 10/1998 | Makita et al. |
| 5,913,113 A | 6/1999 | Seo |
| 6,104,040 A * | 8/2000 | Kawachi et al. ................. 257/59 |
| 6,160,268 A | 12/2000 | Yamazaki |
| 6,166,786 A | 12/2000 | Ohkubo et al. |
| 6,249,027 B1 | 6/2001 | Burr |
| 6,346,717 B1 | 2/2002 | Kawata |
| 6,653,700 B2 * | 11/2003 | Chau et al. ..................... 257/412 |

(Continued)

FOREIGN PATENT DOCUMENTS

EP    0 465 961    1/1992

(Continued)

OTHER PUBLICATIONS

U.S. Appl. No. 11/760,864, filed Jun. 11, 2007, Byoung-Deog Choi et al., Samsung SDI Co., Ltd.

(Continued)

*Primary Examiner* — Ori Nadav
(74) *Attorney, Agent, or Firm* — H.C. Park & Associates, PLC

(57) ABSTRACT

A thin film transistor including an active layer formed on an insulating substrate and having channel, source, and drain regions formed therein; a gate electrode formed over the channel region of the active layer; source and drain electrodes respectively formed over the source and drain regions of the active layer; and a body contact region formed in the active layer so that the body contact region is in contact with the channel region and separated from the source and drain regions, wherein a voltage is applied to the channel region through the body contact region, and the body contact region is connected to the source electrode or the drain electrode.

10 Claims, 6 Drawing Sheets

U.S. PATENT DOCUMENTS

| | | | |
|---|---|---|---|
| 7,038,276 | B2 | 5/2006 | Ker et al. |
| 7,064,388 | B2 | 6/2006 | Hayakawa et al. |
| 7,274,037 | B2 | 9/2007 | Choi et al. |
| 7,276,730 | B2 | 10/2007 | Yamazaki et al. |
| 7,450,100 | B2 | 11/2008 | Koo |
| 7,763,889 | B2 | 7/2010 | Park |
| 2002/0066901 | A1 | 6/2002 | Yamanaka et al. |
| 2002/0125534 | A1 | 9/2002 | Kim et al. |
| 2002/0153569 | A1 | 10/2002 | Katayama |
| 2004/0206956 | A1 | 10/2004 | Yanai et al. |

FOREIGN PATENT DOCUMENTS

| | | |
|---|---|---|
| EP | 0 816 903 A1 | 1/1998 |
| EP | 0 962 988 | 12/1999 |
| JP | 04-115231 | 4/1992 |
| JP | 7-273340 | 10/1995 |
| JP | 10-125908 | 5/1998 |
| JP | 11-54759 | 2/1999 |
| JP | 11-214696 | 8/1999 |
| JP | 2003-7719 | 1/2003 |
| JP | 2003-100902 | 4/2003 |
| JP | 2003-152184 | 5/2003 |
| JP | 2003-174172 | 6/2003 |
| KR | 1996-30429 | 8/1996 |
| KR | 2001-40322 | 5/2001 |
| KR | 2003-3043 A | 1/2003 |
| KR | 2003-69852 A | 8/2003 |
| KR | 2004-92916 | 11/2004 |
| KR | 2005-18530 | 2/2005 |
| KR | 10-2005-0069594 | 7/2005 |
| KR | 10-2006-0012089 | 2/2006 |
| KR | 10-2007-0024016 | 3/2007 |
| WO | WO 99/35678 | 7/1999 |

OTHER PUBLICATIONS

U.S. Appl. No. 11/760,869, filed Jun. 11, 2007, Byoung-Deog Choi et al., Samsung SDI Co., Ltd.
Office Action issued on Oct. 23, 2007 by the Japanese Patent Office for Japanese Patent Application No. 2004-112707.
U.S. Appl. No. 10/938,000, filed Sep. 10, 2004, Jae-Bon Koo, Samsung SDI Co., Ltd.
U.S. Appl. No. 11/510,052, filed Aug. 24, 2006, Byoung-Keong Park, Samsung SDI Co., Ltd.
U.S. Appl. No. 12/045,172, filed Mar. 10, 2008, Byoung-Keong Park, Samsung SDI Co., Ltd.
Office Action issued in U.S. Appl. No. 11/510,052 on Jan. 4, 2008.
Office Action issued in U.S. Appl. No. 11/510,052 on Oct. 28, 2008.
Office Action issued in U.S. Appl. No. 11/510,052 on Apr. 17, 2009.
US Office Action dated Sep. 30, 2010, issued in corresponding U.S. Appl. No. 11/760,864.
US Office Action dated May 3, 2010, issued in corresponding U.S. Appl. No. 11/760,864.
US Office Action dated Jan. 22, 2010, issued in corresponding U.S. Appl. No. 11/760,864.
US Office Action dated Jul. 16, 2009, issued in corresponding U.S. Appl. No. 11/760,864.
US Office Action dated Apr. 21, 2009, issued in corresponding U.S. Appl. No. 11/760,864.
US Office Action dated Feb. 10, 2009, issued in corresponding U.S. Appl. No. 11/760,864.
US Office Action dated Sep. 8, 2008 issued in corresponding U.S. Appl. No. 11/760,864.
US Office Action dated Jun. 27, 2008, issued in corresponding U.S. Appl. No. 11/760,864.
US Office Action dated Sep. 30, 2010, issued in corresponding U.S. Appl. No. 11/760,869.
US Office Action dated Jun. 18, 2010, issued in corresponding U.S. Appl. No. 11/760,869.
US Office Action dated Apr. 9, 2010, issued in corresponding U.S. Appl. No. 11/760,869.
US Office Action dated Nov. 9, 2009, issued in corresponding U.S. Appl. No. 11/760,869.
US Office Action dated May 5, 2009, issued in corresponding U.S. Appl. No. 11/760,869.
US Office Action dated Jan. 28, 2009, issued in corresponding U.S. Appl. No. 11/760,869.
US Office Action dated Aug. 27, 2008, issued in corresponding U.S. Appl. No. 11/760,869.
US Office Action dated Jun. 18, 2008, issued in corresponding U.S. Appl. No. 11/760,869.
US Office Action dated Mar. 11, 2008, issued in corresponding U.S. Appl. No. 11/760,869.
US Office Action dated Sep. 28, 2007, issued in corresponding U.S. Appl. No. 11/760,869.
U.S. Appl. No. 12/889,826, filed Sep. 24, 2010, Byoung-Keon Park et al., Samsung Mobile Display Co., Ltd.
U.S. Final Office Action dated Feb. 10, 2011 in related co-pending U.S. Appl. No. 11/760,864.
U.S. Final Office Action dated Feb. 10, 2011 in related co-pending U.S. Appl. No. 11/760,869.
Advisory Action dated Apr. 19, 2011, issued for related co-pending U.S. Appl. No. 11/760,869.
Advisory Action dated Apr. 21, 2011, issued for related co-pending U.S. Appl. No. 11/760,864.

\* cited by examiner

THIN FILM TRANSISTOR AND DISPLAY DEVICE USING THE SAME

CROSS-REFERENCE TO RELATED APPLICATIONS

This application is a divisional of U.S. patent application Ser. No. 10/827,326 filed Apr. 20, 2004 now U.S. Pat. No. 7,274,037, the disclosure of which is incorporated herein in its entirety by reference. This application claims the benefit of Korean Patent Application No. 2003-27339, filed on Apr. 29, 2003, in the Korean Intellectual Property Office, the disclosure of which is incorporated herein by reference.

BACKGROUND OF THE INVENTION

1. Field of the Invention

The present invention relates to a thin film transistor used in a display device, and, more particularly, to a thin film transistor capable of preventing a kink effect by forming an impurity region for body contact on an active layer, and a flat panel display using the same.

2. Description of the Related Art

A polysilicon thin film transistor used in a conventional flat panel display is a floating body TFT in which an island shaped active layer is floated. The floating body TFT has problems in that a kink effect such as breakdown and fluctuation of threshold voltage is generated by a strong lateral electric field at the drain side as the size of the floating body TFT is reduced. That is, there have been problems in the floating body TFT having an island shaped active layer in that a kink effect is generated as a path for discharging undesired hot carriers generated by the strong lateral electric field of the drain side, for example.

SUMMARY OF THE INVENTION

Therefore, in order to solve the foregoing and/or other problems of the conventional art, it is an aspect of the present invention to provide a thin film transistor capable of preventing a kink effect by forming a body contact region for discharging hot carriers on an active layer, and a flat panel display using the thin film transistor.

Additional aspects and/or advantages of the invention will be set forth in part in the description which follows and, in part, will be obvious from the description, or may be learned by practice of the invention.

In order to achieve the foregoing and/or other aspects, the present invention provides a thin film transistor comprising an active layer formed on an insulating substrate and having channel, source, and drain regions formed therein, wherein a voltage is applied to the channel region to discharge hot carriers generated in the channel region.

The active layer may further comprise a bias supply layer contacted with the channel region and separated from the source and drain regions; and a contact wiring connected to the bias supply layer to apply the voltage to the channel region through the bias supply layer. A conductivity type of the bias supply layer may be different from a conductivity type of the source and drain regions, and the voltage applied to the bias supply layer is equal to a voltage applied to the source or drain region.

Furthermore, the present invention provides a thin film transistor comprising an active layer formed on an insulating substrate and having channel, source, and drain regions formed therein; a gate electrode formed over the channel region of the active layer; source and drain electrodes respectively formed over the source and drain regions of the active layer; and a body contact region formed in the active layer so that the body contact region is contacted with the channel region and separated from the source and drain regions, wherein a voltage is applied to the channel region through the body contact region.

The body contact region may be directly connected to the source electrode or the drain electrode so that the voltage applied to the channel region is equal to a voltage applied to the source or drain electrode.

The thin film transistor may further comprise a contact wiring connecting the body contact region to the source electrode or drain electrode, and the voltage applied to the channel region through the body contact region may be equal to a voltage applied to the source or drain electrode, and may be applied through the contact wiring to the body contact region.

Furthermore, the present invention provides a flat panel display comprising a gate line, a data line and a power supply line; and a plurality of pixels connected to the lines, wherein each of the pixels comprises one or more thin film transistors including channel, source, and drain regions in an active layer, and a voltage is applied to the channel region of the thin film transistor to discharge hot carriers.

The thin film transistor may further comprise a bias supply layer formed in the active layer so that the bias supply layer is contacted with the channel region and separated from the source and drain regions; and a contact wiring connected to the bias supply layer to apply the voltage to the channel region. A conductivity type of the bias supply layer may have a different conductivity type from the source and drain regions.

Furthermore, the present invention provides a flat panel display comprising a plurality of pixels arranged in a matrix shape, each of the pixels including at least one thin film transistor, wherein the at least one thin film transistor in each of the pixels comprises an active layer having channel, source, and drain regions formed therein, and source and drain electrodes connected to the source and drain regions, respectively, and the active layer further includes a bias supply layer to supply a bias voltage to the channel region.

Furthermore, the present invention provides a method of fabricating a thin film transistor comprising: forming an active layer on a insulating substrate; forming a gate insulation film on the insulating substrate; forming source, drain, and body contact regions which are separated by a channel region in the active layer; forming a gate on the gate insulation film; forming an interlayer insulation film on substrate; and forming source and drain electrodes electrically connected with the source and drain regions, respectively, wherein a voltage is applied to the channel region of the active layer through the body contact region.

The body contact region may be directly connected to the source or drain electrode, and the voltage may be directly applied to the body contact region from the source or drain electrode.

The method of fabricating a thin film transistor may further comprise forming a contact wiring, electrically connected to the body contact region, at the same time of the forming of the source and drain electrodes. The body contact region may be connected to the source or drain electrode through the contact wiring, and the voltage is applied to the body contact region through the contact wiring from the source or drain electrode.

The forming of the source, drain, and body contact regions and the forming of the gate may comprise: forming the body contact region by ion implanting impurities of a first conductivity type into the active layer using a first photosensitive film pattern; forming a gate electrode on the gate insulation film; and forming the source and drain regions by ion implanting impurities of a second conductivity type into the active layer using a second photosensitive film pattern and the gate electrode as a mask, wherein a portion on which impurities of the first and second conductivity types are not doped in the active layer functions as the channel region, and the channel region is contacted with the source and drain regions and body contact region so that the source, drain, and body contact regions are separated by the channel region.

The forming of the source, drain, and body contact regions and the forming of the gate may comprise: forming a gate electrode; forming the source and drain regions by ion implanting impurities of a first conductivity type into the active layer using a first photosensitive film pattern and the gate electrode as a mask; and forming the body contact region by ion implanting impurities of a second conductivity type into the active layer using a second photosensitive film pattern, wherein a portion on which impurities of the first and second conductivity types are not doped in the active layer functions as the channel region, and the channel region is contacted with the source and drain regions and the body contact region so that the source, drain, and body contact regions are separated by the channel region.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
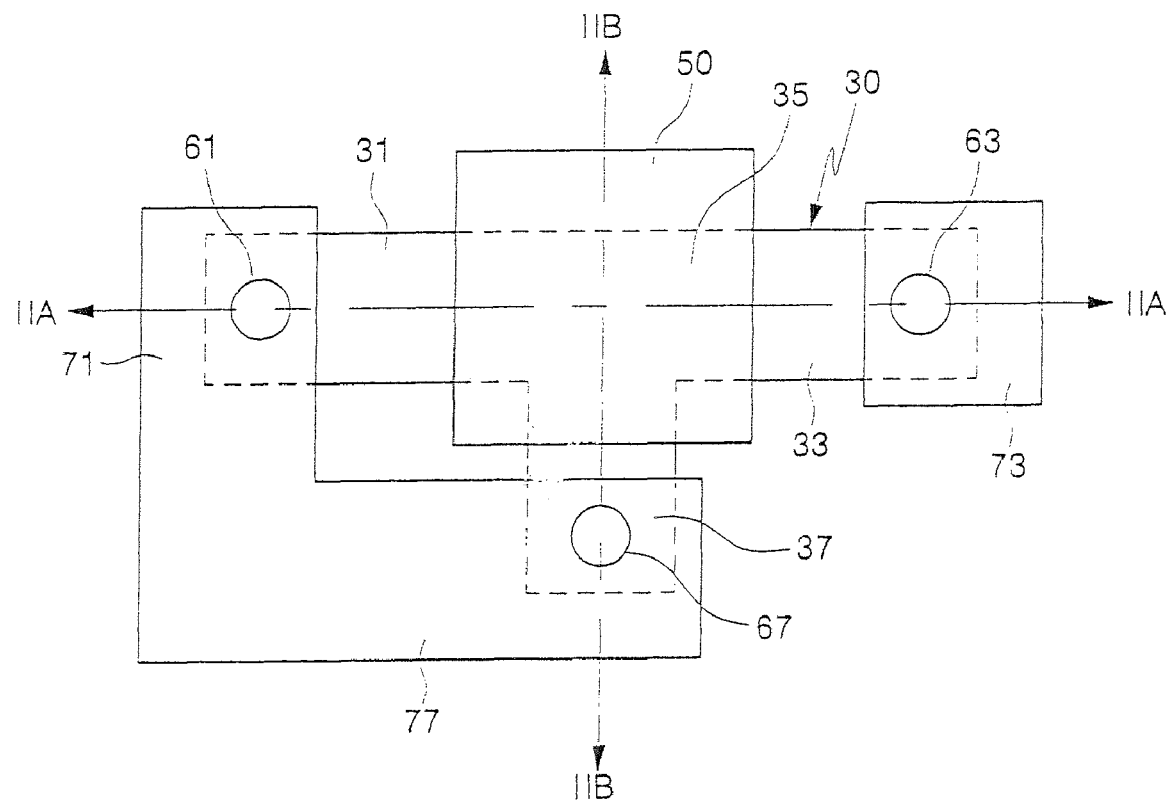
FIG. 1 is a plan view of a thin film transistor according to an embodiment of the present invention.

Reference will now be made in detail to the embodiments of the present invention, examples of which are illustrated in the accompanying drawings, wherein like reference numerals refer to the like elements throughout. The embodiments are described below to explain the present invention by referring to the figures.

Figure 2:
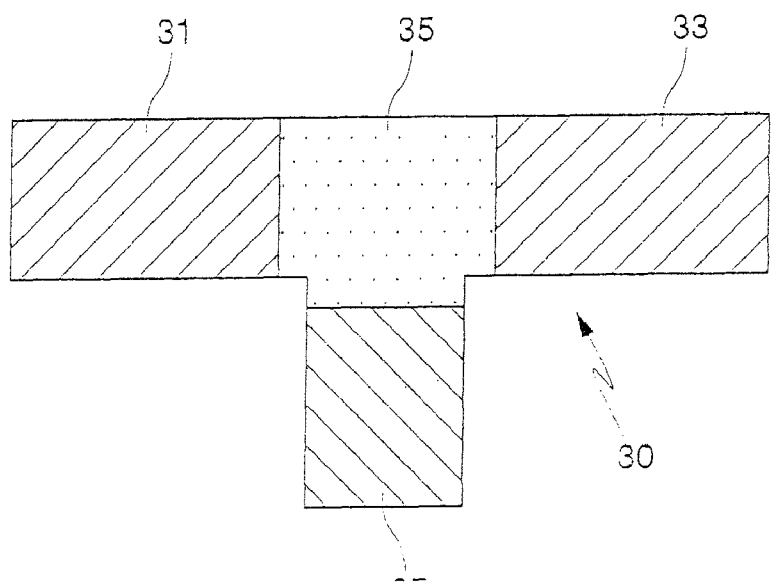
FIG. 2 is a plan view of an active layer of the thin film transistor of FIG. 1.

FIG. 1 is a plan view of a thin film transistor according to an embodiment of the present invention, and FIG. 2 is a plan view of an active layer of the thin film transistor of FIG. 1.

Referring to FIG. 1 and FIG. 2, the thin film transistor includes an active layer 30, a gate electrode 50, and source/drain electrodes 71 and 73. The active layer 30 includes source/drain regions 31 and 33, a channel region 35 between the source/drain regions 31 and 33, and a body contact region 37 separated from the source/drain regions 31 and 33.

The gate electrode 50 is formed over the channel region 35 of the active layer 30. The source electrode 71 is formed over the source region 31 so that the source electrode 71 is electrically connected to the source region 31 through a contact 61. The drain electrode 73 is formed over the drain region 33 so that the drain electrode 73 is electrically connected to the drain region 33 through a contact 63. On the other hand, a contact wiring 77 is formed correspondingly to the body contact region 37 in such a way that the contact wiring 77 is electrically connected to the body contact region 37 through the contact 67, and directly connected to the source electrode 71.

In this embodiment of the present invention, the source/drain regions 31 and 33 and the body contact region 37 have different conductivity types. For example, if the source/drain regions 31 and 33 are comprised of an n-type high concentration impurity region, the body contact region 37 may be comprised of a p-type high concentration impurity region, while if the source/drain regions 31 and 33 are comprised of a p-type high concentration impurity region, the body contact region 37 may be comprised of an n-type high concentration impurity region. The channel region 35 of the active layer 30 is an intrinsic region on which first or second conductivity type impurities are not doped.

Although the contact wiring 77 for applying the bias voltage to the body contact region 37 is integrally formed with the source electrode 71 in FIG. 1, other embodiments are possible. The contact wiring 77 may be separately formed from the source electrode 71, and a separate wiring may be formed to connect the contact wiring 77 and the source electrode 71 so that a bias voltage applied to the source electrode 71 may be applied to the body contact region using the separate wiring. Furthermore, without formation of the contact wiring 77, the source electrode 71 may be directly contacted to the body contact region 37 through the contact 67, and the voltage is applied to the body contact region 37 from the source electrode 71.

Also, although the contact wiring 77 is connected to the source electrode 71 in FIG. 1, the contact wiring 77 may be connected to the drain electrode 73.

Figure 3:
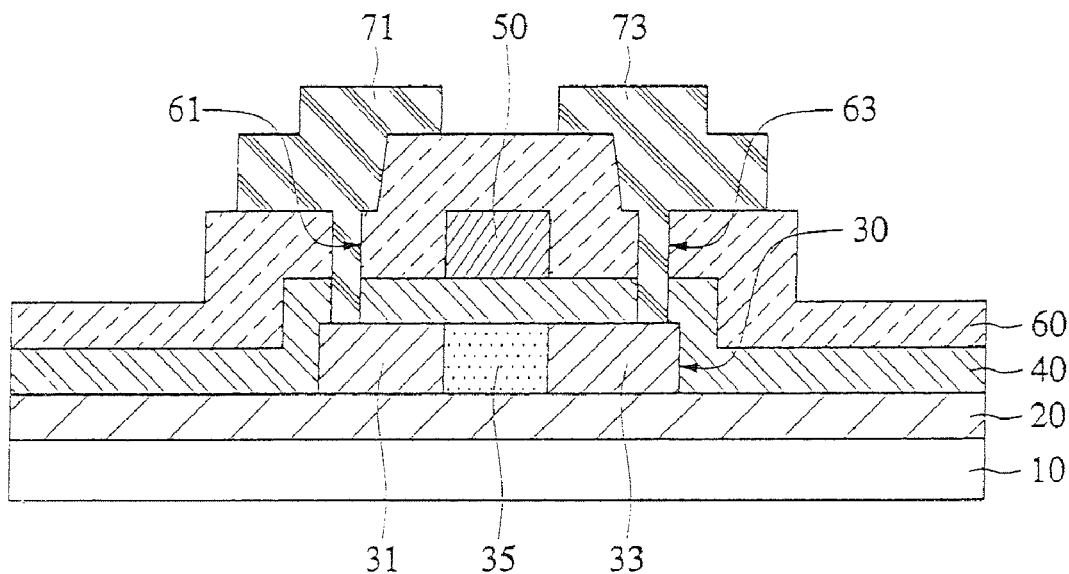
FIG. 3 is a cross sectional view of the thin film transistor of FIG. 1 taken along a line IIA-IIA of FIG. 1.
Figure 4:
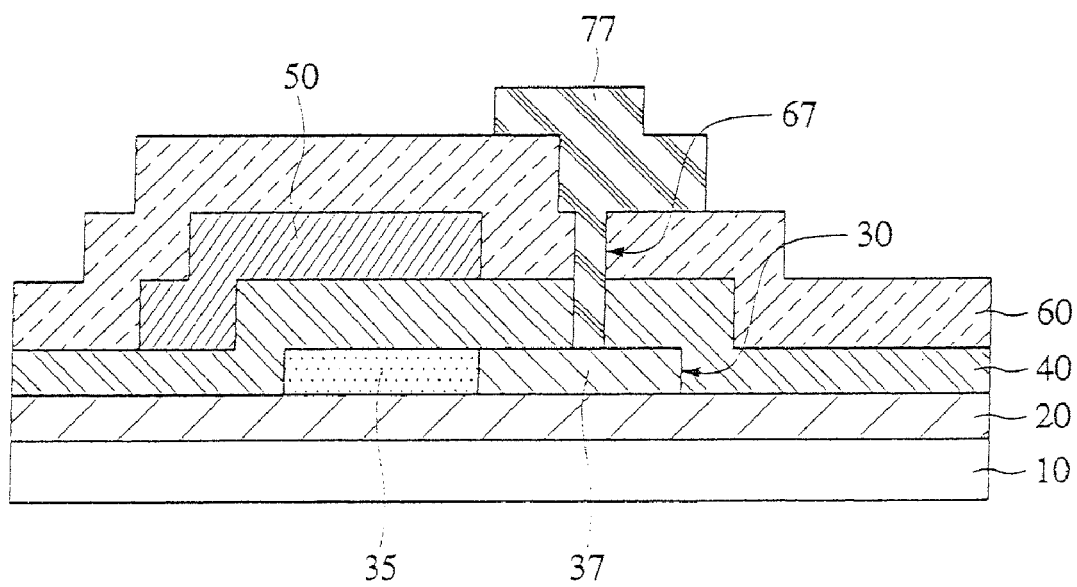
FIG. 4 is a cross sectional view of the thin film transistor of FIG. 1 taken along a line IIB-IIB of FIG. 1.

FIG. 3 and FIG. 4 respectively illustrate cross sectional views taken along lines IIA-IIA and IIB-IIB of FIG. 1. A fabrication method of the thin film transistor of FIG. 1, referring to FIG. 3 and FIG. 4, is described as follows.

After forming a buffer layer 20 on an insulating substrate 10 and depositing an amorphous silicon film on the buffer layer 20, as illustrated in FIG. 2, the deposited amorphous silicon film is crystallized into a polysilicon film using an ordinary crystallization method, and the polysilicon film is patterned to form an island shaped active layer 30.

Subsequently, a first photosensitive film (not illustrated on drawing) is formed so that only a portion of the active layer 30, on which the body contact region 37 is to be formed, is exposed. The body contact region 37 is formed by ion implanting high concentration impurities of a first conductivity type into the exposed portion of the active layer, using the first photosensitive film as a mask. The body contact region 37 is formed in such a way that one side surface of the body contact region 37 is contacted with the channel region 35, and the body contact region 37 is separated from the source/drain regions 31 and 33 by the channel region 35.

Next, a gate insulation film 40 is formed on the substrate, and a conductive material such as a metallic material is deposited on the gate insulation film 40 and patterned to form a gate electrode 50. A second photosensitive film (not illustrated on drawing) is formed on a portion of the gate insulation film 40 corresponding to the body contact region 37, and the source/ drain regions 31 and 33 are formed by ion implanting impurities of a second conductivity type, different from the first conductivity type of the body contact region 37, into the active layer 30 using the gate electrode 50 and the second photosensitive film as a mask.

Contacts 61, 63, and 67, exposing the source/drain regions 31 and 33 and the body contact region 37, respectively, are formed by etching an interlayer insulation film 60 and the gate insulation film 40 after depositing the interlayer insulation film 60 on the substrate. Subsequently, the source/drain electrodes 71 and 73, respectively connected to the source/drain regions 31 and 33 through the contacts 61 and 63, are formed. The contact wiring 77, which is directly connected to one of the source/drain electrodes 71 and 73, and electrically connected to the body contact region 37 through contact 67, is formed, by depositing a conductive material such as a metallic material on the substrate, and then patterning the deposited conductive material.

In an embodiment of the present invention, the body contact region 37 functions as a bias supply layer which discharges hot carriers generated in the channel layer 35 by applying a certain voltage to the channel layer 35. Therefore, the structure of the active layer 30 and the position in the active layer 30 at which the body contact region 37 is formed are not limited to the embodiment illustrated in FIG. 1 and FIG. 2. Therefore, many structures are possible in which the body contact region 37 is formed on active layer 30 so that the body contact region 37 is contacted with the channel layer 35, and is separated from the source/drain regions 31 and 33, so as to discharge undesired hot carriers generated in the channel layer 35 at the drain side by applying a certain voltage to the channel layer 35 through the body contact region 37.

Although the source/drain regions 31 and 33 are formed after forming the body contact region 37 in this embodiment of the present invention, the body contact region 37 can also be formed after forming the source/drain regions 31 and 33. This is accomplished by forming the first photosensitive film on the gate insulation film 40 so that only a portion of the gate insulation film 40 corresponding to the body contact region 37 is exposed and ion implanting impurities of the first conductivity type into the active layer 30 using the first photosensitive film as a mask after forming the source/drain regions 31 and 33 of the second conductivity type using the second photosensitive film and the gate electrode 50 as a mask.

Furthermore, the source/drain regions 31 and 33 can be applied to a thin film transistor having an LDD structure of a high concentration impurity region and a low concentration impurity region, although it is described in the embodiment of the present invention discussed above that the body contact region 37 is formed on a thin film transistor in which the source/drain regions 31 and 33 are comprised of high concentration impurity regions.

The hot carriers generated at the interface between the drain region 33 and the channel region 35 by a lateral electric field of the drain region 33 during operation of the thin film transistor having the foregoing structure are drawn through the body contact region 37, so that a kink effect can be prevented by preventing the hot carriers from moving to the source region 31.

Figure 5:
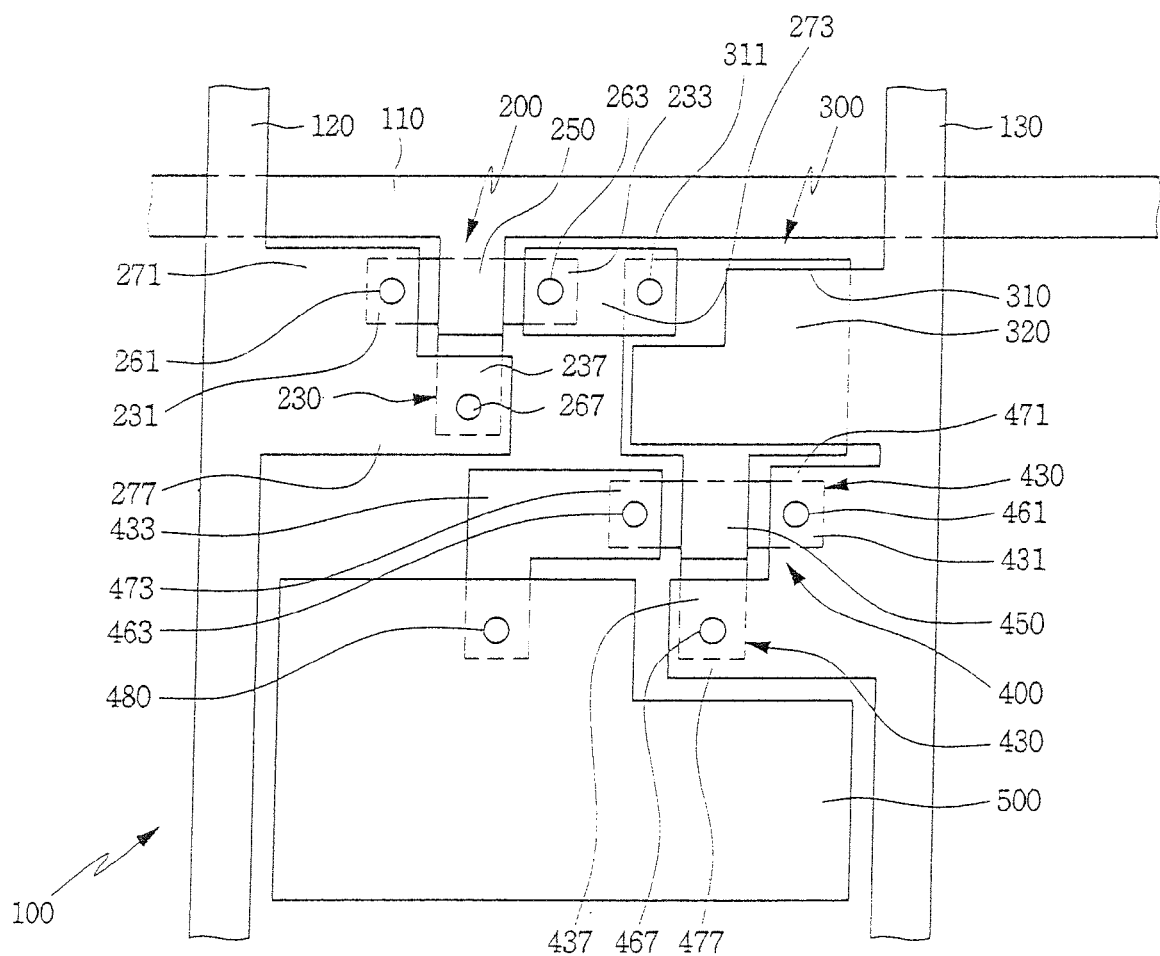
FIG. 5 is a plan view of a flat panel display using a thin film transistor having a body contact region according to an embodiment of the present invention.

FIG. 5 illustrates a plan view of an organic electroluminescent display device using the thin film transistor having the body contact region of FIG. 1, and is limited to one pixel.

Referring to FIG. 5, an organic electroluminescent display device 100 of this embodiment of the present invention comprises a gate line 110, a data line 120, a power supply line 130, and a pixel connected to the gate line 110, data line 120, and power supply line 130. The pixel comprises a switching transistor 200, a capacitor 300, a driving transistor 400, and an EL device including a pixel electrode 500.

The switching transistor 200 comprises an active layer 230 including source/drain regions 231 and 233 and a body contact region 237 formed therein; a gate electrode 250 connected to the gate line 110; a source electrode 271 connected to the data line 120 and connected to the source region 231 through a contact 261; and a drain electrode 273 connected to the drain region 233 through a contact 263. Furthermore, the switching transistor 200 further comprises a contact wiring 277 directly connected to the data line 120 and the source electrode 271, and connected to the body contact region 237 through a contact 267.

The capacitor 300 comprises a lower electrode 310 connected to the drain electrode 273 of the switching transistor 200 through a contact 311 and an upper electrode 320 connected to the power supply line 130.

The driving transistor 400 comprises an active layer 430 including source/drain regions 431 and 433 and a body contact region 437 formed therein; a gate electrode 450 connected to the lower electrode 310 of the capacitor 300; a source electrode 471 connected to the power supply line 130 and connected to the source region 431 through a contact 461; and a drain electrode 473 connected to the drain region 433 through a contact 463. Furthermore, the driving transistor 400 further comprises a contact wiring 477 directly connected to the power supply line 130 and the source electrode 471, and connected to the body contact region 437 through a contact 467.

Although it is not illustrated in FIG. 5, the EL device comprises a lower electrode, which is a pixel electrode 500 connected to the drain electrode 473 of the driving transistor 400 through a via hole 480, and an organic thin film layer comprising at least one layer selected from a hole injection layer, a hole transport layer, an emitting layer, a hole barrier layer, an electron transport layer, and an electron injection layer.

Although a flat panel display according to the discussed embodiment of the present invention comprises a structure in which one pixel is comprised of two thin film transistors, one capacitor, and an EL device, the flat panel display may be applied to all pixel structures comprising thin film transistors in which the body contact region is formed in the active layer.

Figure 6:
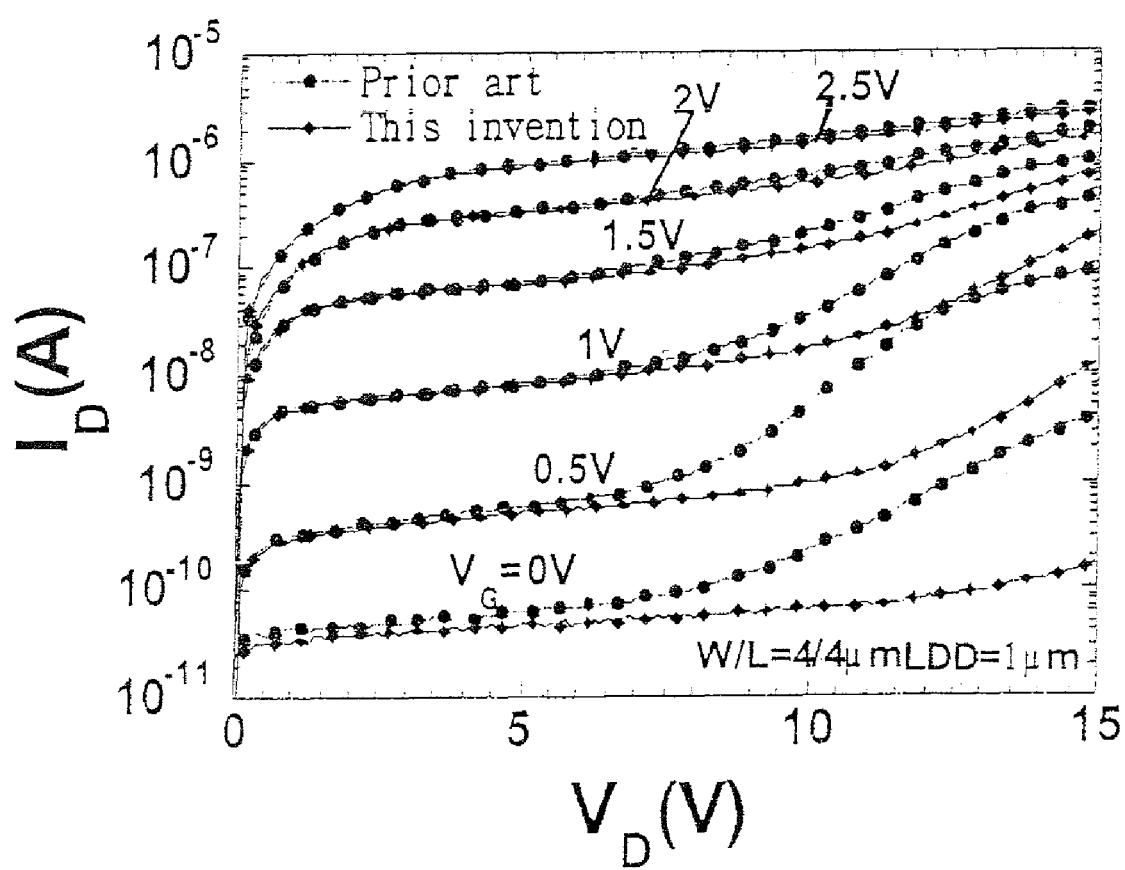
FIG. 6 and FIG. 7 are drawings illustrating characteristics of a conventional floating body TFT and a TFT having a body contact region according to an embodiment of the present invention.
Figure 7:
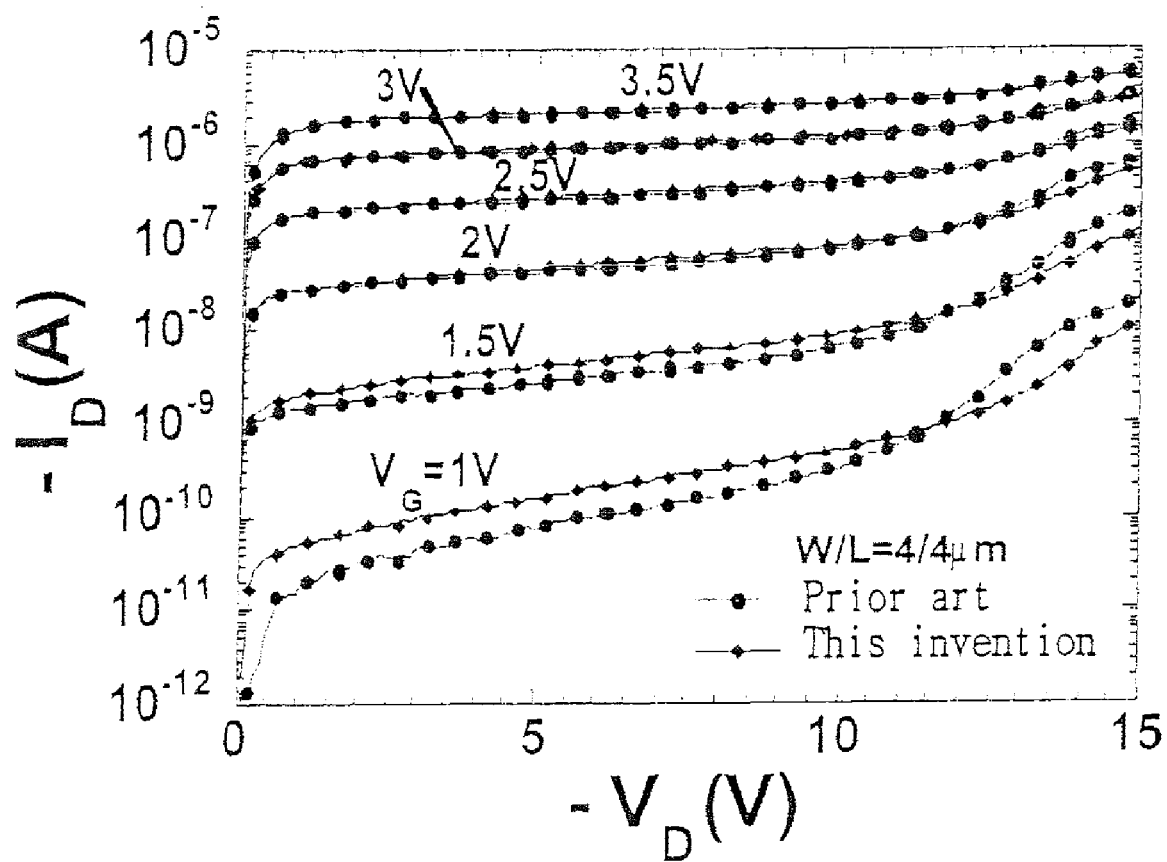

FIG. 6 and FIG. 7 illustrate operation characteristics of a conventional floating body TFT and the TFT having the body contact region of an embodiment of the present invention. FIG. 6 illustrates ID-VD characteristics of the TFT of an embodiment of the present invention and a TFT of the conventional art in the case of an n-type thin film transistor in which W/L=4 μm/4 μm and width of LDD region is 1 μm. FIG. 7 illustrates ID-VD characteristics of the TFT of an embodiment of the present invention and a TFT of the conventional art in the case of p-type thin film transistor in which W/L=4 μm/4 μm.

Referring to FIG. 6 and FIG. 7, it can be seen that kink free characteristics of the TFT having the body contact region in the active layer of the present invention is superior compared to a conventional TFT in which the active layer is floated, wherein ID-VD characteristics between an n-type TFT and a p-type TFT are different since the impact ionization of holes is less than the impact ionization of electrons.

Figure 8:
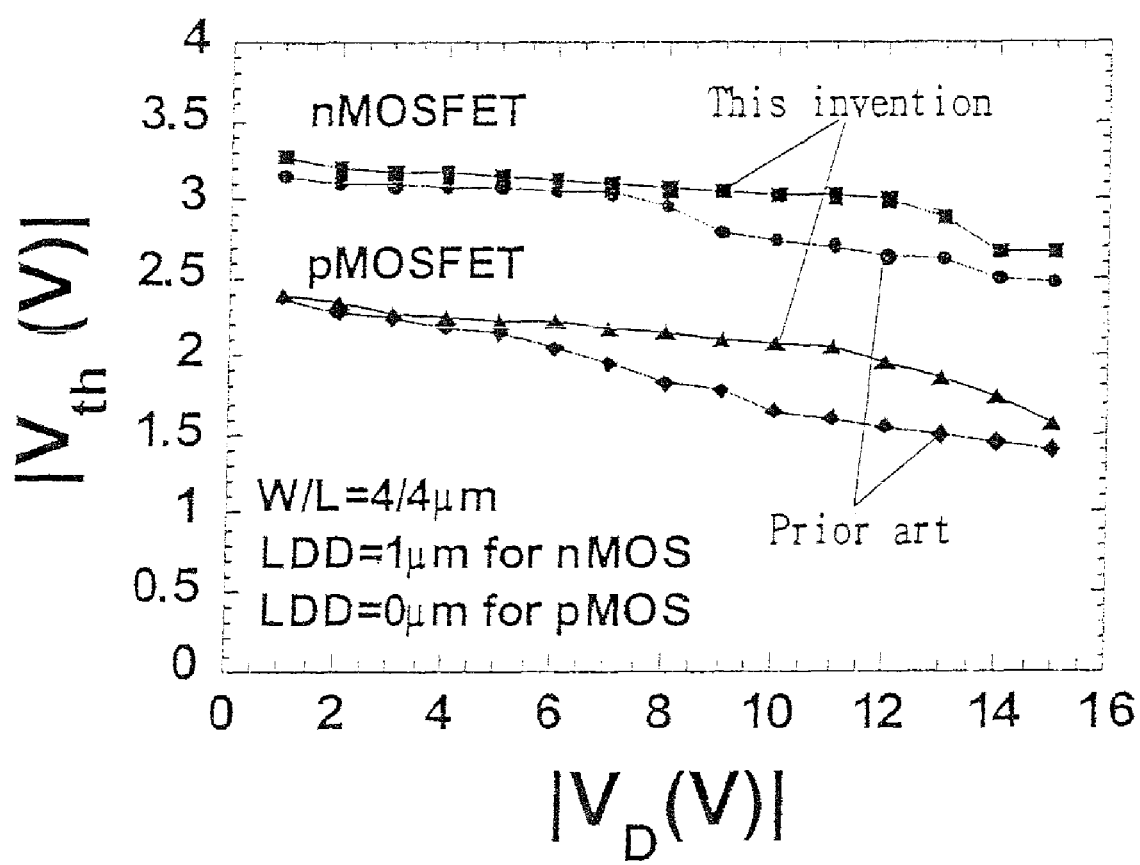
FIG. 8 is a drawing illustrating a variation of threshold voltage according to drain voltage in a conventional floating body TFT and a TFT having a body contact region according to an embodiment of the present invention.

FIG. 8 illustrates variation of threshold voltage according to drain voltage in a conventional floating body TFT and the TFT having the body contact region of an embodiment of the present invention. Referring to FIG. 8, it can be seen that the TFT of the present invention is more stable than the conventional TFT since variation of threshold voltage according to drain voltage is less in the TFT of the present invention compared to the conventional TFT.

According to embodiments of the present invention as described above, a kink effect can be reduced more effectively so that the characteristics of a TFT are improved accordingly by forming a body contact region for electrically discharging hot carriers on the active region.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A thin film transistor, comprising:
    an active layer formed on an insulating substrate and having a channel region, a source region, and a drain region formed therein;
    a gate electrode formed over the channel region;
    a source electrode and a drain electrode respectively formed over the source region and the drain region, and electrically connected to the source region and the drain region, respectively;
    a body contact region formed in the active layer so that the body contact region is in contact with the channel region, and separated from the source region and the drain region by the channel region; and
    a connection having a contact wiring directly connected to both the body contact region and the source electrode or the drain electrode and formed between the body contact region and the source electrode or the drain electrode, such that a voltage is applicable to the channel region through the body contact region and to the source electrode or the drain electrode,
    wherein the body contact region is directly connected with the channel region and only connected with the channel region from among the source region, the drain region and the channel region in the active layer, and
    wherein the body contact region is physically connected to the source electrode or the drain electrode by the contact wiring.

2. The thin film transistor according to claim 1, wherein the connection comprises the source electrode or the drain electrode being directly connected to the body contact region so that the voltage applied to the channel region is equal to a voltage applied to the source electrode or the drain electrode.

3. The thin film transistor according to claim 2, wherein the source region, the drain region and the body contact region are impurity regions, and the channel region is an intrinsic region.

4. The thin film transistor according to claim 3, wherein a conductivity type of the body contact region is different from a conductivity type of the source region and the drain region.

5. The thin film transistor according to claim 1, wherein the contact wiring connects the body contact region to the source electrode or the drain electrode and the contact wiring and the source electrode or the drain electrode are formed to be one integral part.

6. The thin film transistor according to claim 5, wherein the voltage applied to the channel region through the body contact region is equal to a voltage applied to the source electrode or the drain electrode, and is applied though the contact wiring to the body contact region.

7. The thin film transistor according to claim 5, wherein the source region and the drain region and the body contact region are impurity regions, and the channel region is an intrinsic region.

8. The thin film transistor according to claim 7, wherein a conductivity type of the body contact region is different from a conductivity type of the source region and the drain region.

9. The thin film transistor according to claim 1, wherein the voltage applied to the channel region through the body contact region is equal to a voltage supplied from the source electrode or the drain electrode through the contact wiring.

10. The thin film transistor according to claim 1, wherein the width of the channel region that separates the source region and the drain region is wider than a width of the body contact region that directly contacts the channel region.

* * * * *